(12) United States Patent
Ishikawa et al.

(10) Patent No.: US 6,886,243 B2
(45) Date of Patent: May 3, 2005

(54) METHOD FOR MANUFACTURING A FLAT PANEL DISPLAY MODULE

(75) Inventors: Takashi Ishikawa, Tokyo (JP); Yuji Kondo, Tokyo (JP); Akihiro Yano, Tokyo (JP)

(73) Assignee: NEC Corporation, Tokyo (JP)

( * ) Notice: Subject to any disclaimer, the term of this patent is extended or adjusted under 35 U.S.C. 154(b) by 31 days.

(21) Appl. No.: 10/408,111

(22) Filed: Apr. 8, 2003

(65) Prior Publication Data

US 2003/0143766 A1 Jul. 31, 2003

Related U.S. Application Data

(62) Division of application No. 09/927,498, filed on Aug. 13, 2001, now Pat. No. 6,777,621.

(30) Foreign Application Priority Data

Aug. 11, 2000 (JP) ........................................ 2000-243943

(51) Int. Cl.[7] .............................. H05K 3/00; H05K 1/00

(52) U.S. Cl. .............................. 29/829; 29/830; 29/831; 29/832; 29/854; 174/254

(58) Field of Search .......................... 29/829, 832, 854, 29/830, 831; 174/254; 438/22, 26, 28; 361/749; 385/146; 257/99

(56) References Cited

U.S. PATENT DOCUMENTS

| 4,821,051 A | * | 4/1989 | Hediger ....................... 347/130 |
| 5,321,429 A | * | 6/1994 | Ono et al. ................... 347/238 |
| 5,546,496 A | * | 8/1996 | Kimoto et al. .............. 385/146 |
| 5,883,465 A | * | 3/1999 | Inoguchi et al. ............ 313/509 |
| 5,931,577 A | * | 8/1999 | Ishibashi ..................... 362/249 |

FOREIGN PATENT DOCUMENTS

| JP | 1-161597 | 11/1989 |
| JP | 2-227989 | 9/1990 |
| JP | 6-230728 | 8/1994 |
| JP | 2612968 | 2/1997 |
| JP | 2000-3140 | 1/2000 |

* cited by examiner

Primary Examiner—A. Dexter Tugbang
Assistant Examiner—Tai Van Nguyen
(74) Attorney, Agent, or Firm—Young & Thompson

(57) ABSTRACT

A manufacturing method for a flat panel display module includes forming a display section having a transparent substrate with a wiring line terminal section adjacent at least one edge. A light emitting section is a center section, with a sealing cap covering the light emitting section. The sealing cap is dimensioned such that an edge of said sealing cap nearest the wiring line terminal section lies inside the wiring line terminal section. A flexible printed circuit board is provided with a semiconductor device mounted thereon. The flexible printed circuit board is connected to the wiring line terminal section of the transparent substrate, and a frame is fixed around the transparent substrate.

16 Claims, 5 Drawing Sheets

METHOD FOR MANUFACTURING A FLAT PANEL DISPLAY MODULE

BACKGROUND OF THE INVENTION

1. Field of the Invention

The present invention relates to a flat panel display module and a manufacturing method, and more particularly to a flat panel display module which is made thin and small and a manufacturing method of the same.

2. Description of the Related Art

As a display unit used in an electronic unit like a mobile phone which is portable and small, flat panel display units such as an LCD and an organic EL display are known. Because the module of such a flat panel display unit is incorporated into the portable electronic equipment, the module is desired to be small and light.

Here, a conventional technique about the flat panel display module is disclosed in Japanese Laid Open Utility Model Application (JU-A-Heisei 1-161597). In this conventional technique, a flat panel display module is composed of a transparent substrate (1), a circuit board (18), many external lead connection terminal sections (23), and a the flexible lead (15). The transparent substrate (1) and the circuit board (18) are arranged in a laminate layer and the thickness of the module becomes thick. The flexible lead (15) is connected with the terminal sections (23) of the transparent substrate (1) and is connected with the circuit board (18). Therefore, the flexible lead (15) is connected to be turned back. Here, the effective connectable length of the terminal section is equal to or more than twice the connection length of the terminal section of the flexible lead (15).

Also, a thin film EL display unit is disclosed in the Japanese Laid Open Patent application (JP-A-Heisei 2-227989). In this conventional technique, like the above-mentioned conventional technique, an organic EL panel (10) and a printed circuit board (30) are arranged in a laminate layer. The flexible printed circuit board (40) turns back twice after connection with the organic EL panel (10) and is connected with the printed circuit board (30), and moreover, is turned back and is connected with the back of printed circuit board (30). In this conventional technique, there is a possibility that the wiring lines of the flexible printed circuit board (40) are broken. Also, in this structure, it is not possible to decrease the thickness of the film EL display unit.

Also, the connection structure of a flat display is disclosed in the Japanese Laid Open Patent application (JP-A-Heisei 6-230728). In this conventional technique, the flat display is composed of a flat display panel (1), a drive board (3), one side the flexible printed circuit board (14) and a connection cable (17). The one side the flexible printed circuit board (14) is provided with the printed circuits with a driver IC (6). The connection cable (17) is connected with the drive board (3), and is turned back twice and is connected with the one end of one side the flexible printed circuit board (14). The one side the flexible printed circuit board (14) connected with the connection cable (17) is connected with the driver IC (6) apart from the drive board (3) into a lateral direction. In this way, the connection cable (17) is bent like the character of S and is possibly broken. Also, because the driver IC (6) is apart from the drive board (3), the size in the lateral direction cannot be made small.

Also, an organic EL display is disclosed in Japanese Laid Open Patent Application (2000-3140). In this conventional technique, an organic EL display is composed of a substrate (1), an organic EL structure, a sealing plate (2) and a wiring line structure (3). The circuit for sealing plate (2) to do an organic EL structure at the sealing and to drive and to control an organic EL structure is prepared onto the superficies. The wiring line structure (3) connects the circuit which is formed on substrate (1) and the circuit of sealing plate (2). This wiring line structure (3) section is arranged in the position where sealing plate (2) on substrate (1) is not arranged. Moreover, the wiring line structure (3) has a circuit on an externally orientated surface. In this example, the wiring line structure (3) is composed of some portions and it is necessary to connect them. Also, the wiring line structure (3) and the sealing plate (2) are connected with the bonding wires. Therefore, the manufacturing method of the organic EL display takes large cost and time. Also, because the sealing plate (2) and the wiring line structure (3) are used, it is not possible to reduce the thickness of the organic EL display.

Also, a display unit is disclosed in Japanese Patent No. 2,612,968. In this conventional technique, a flexible printed circuit board is bent to be turned back from a support plate to a hard printed circuit board. Therefore, there is a fear that a wiring lien is broken. Also, a display panel drive circuit is mounted in the hard printed circuit board, and the hard printed circuit board is provided externally from the support plate in which a display panel is formed to a lateral direction. Therefore, there is a problem that the size to the lateral direction has become large compared with the display size of the display panel.

SUMMARY OF THE INVENTION

Therefore, an object of the present invention is to provide a flat panel display module which is made small and thin.

Another purpose of the present invention is to provide a manufacturing method of a flat panel display module, in which the number of steps can be reduced and also a process is easy so that the reduction in costs is possible.

Another purpose of the present invention is to provide a flat panel display module and a manufacturing method, in which a flexible printed circuit board is connected without being turned back.

Another purpose of the present invention is to provide a flat panel display module and a manufacturing method, in which break of a wiring line in a flexible printed circuit board can be prevented.

Another purpose of the present invention is to provide a flat panel display module and a manufacturing method, in which a flexible printed circuit board can be connected to a wiring line connection sections at both opposite ends.

Another purpose of the present invention is to provide a flat panel display module and a manufacturing method, in which it is possible to surely connect the flexible printed circuit board with very short terminals.

Another purpose of the present invention is to provide a flat panel display module and a manufacturing method, wherein the connection section of the flexible printed circuit board is supported.

Another purpose of the present invention is to provide a flat panel display module and a manufacturing method in which it is possible to apply to an organic EL unit.

In an aspect of the present invention, a flat panel display module includes a transparent substrate, a light emitting section, a sealing cap, a flexible printed circuit board and a semiconductor device. The transparent substrate with a wiring line terminal section is formed on one of surfaces of the transparent substrate in at least one of opposing ends of the transparent substrate. The light emitting section is provided in a display region in a center section on the surface on which the wiring line terminal section of the transparent substrate is formed. The sealing cap is provided for a sealing region to cover the light emitting section such that ends of the sealing cap does not reach the ends of the transparent substrate or the wiring line terminal section of the transparent substrate. The flexible printed circuit board is connected to the wiring line terminal section and extending along the sealing cap of the transparent substrate. The semiconductor device is mounted on the flexible printed circuit board for the light emitting section.

The semiconductor device may be mounted on a side of the flexible printed circuit board of the sealing cap.

Also, the flexible printed circuit board may have wiring line patterns for the semiconductor device on both sides thereof in a portion corresponding to the display region.

Also, the flexible printed circuit board may be provided to extend along the transparent substrate and the sealing cap without being turned back.

Also, the flexible printed circuit board may be bent at least twice between the wiring line terminal section and the display region such that the flexible printed circuit board is approximately parallel to the transparent substrate in the display region. In this case, the flexible printed circuit board may be bent to a first direction opposite to the transparent substrate in a first position between the wiring line terminal section of the transparent substrate and the sealing cap, may be bent to the first direction in a second position between the first position and the terminal section of the sealing cap, and may be bent to the second direction opposite to the first direction in a third position between the second position and the terminal section of the sealing cap. In this case, a bending angle in the first position is within 60 degrees.

Also, in the first position, the wiring line pattern of the flexible printed circuit board may be formed only on one side. In this case, in the second position, the wiring line pattern of the flexible printed circuit board may be formed on both sides and a resist film is applied.

Also, a bending angle in the second position may be within 90 degrees and a summation of the bending angle in the first position and the bending angle in the second position is desirably equal to or less than 90 degrees.

Also, the flexible printed circuit board may be bent to the second direction approximately parallel to the transparent substrate in the third position.

Also, a metal film may be formed on the back side of the flexible printed circuit board in one or both of the second position and the third position.

Also, the flexible printed circuit board may be bent to the first direction opposite to the transparent substrate in a fourth position between the end of the sealing cap and the end of the light emitting section, and may be bent to the second direction opposite to the first direction in a fifth position between the fourth position and the end of the light emitting section. In this case, in the fourth position, the wiring line patterns of the flexible printed circuit board may be formed on both sides of the flexible printed circuit board and a resist film is applied.

Also, the flexible printed circuit board may be bent to the second direction approximately parallel to the transparent substrate in the fifth position.

Also, the flat panel display module may further include a frame provided along the end of the transparent substrate.

Also, the frame may support the flexible printed circuit board together with the end of the sealing cap.

Also, the wiring line terminal section may be formed on both of the surface of the opposite ends of the transparent substrate, and the flexible printed circuit board is connected with the both of the wiring line terminal sections.

Also, the wiring line terminal section may be formed on both of the surface of the opposite ends of the transparent substrate, and the flexible printed circuit board is connected with the both of the wiring line terminal sections.

Also, the light emitting section may be an organic EL film.

Also, the light emitting section may be an organic EL film, and the flat panel display module may further include a desiccant section between the light emitting section and the sealing cap in a center section of the display region, the sealing cap has a protrusion section corresponding to the desiccant section. A plurality of the semiconductor devices may be provided on the flexible printed circuit board on a side of the transparent substrate between the protrusion section of the sealing cap and the end of the sealing cap.

In a second aspect of the present invention, a manufacturing method of a flat panel display module, is attained by (a) forming a display section, wherein the display section include a transparent substrate having a wiring line terminal section which is formed on one of surfaces of the transparent substrate in at least one of opposing ends of the transparent substrate; a light emitting section provided in a display region in a center section on the surface on which the wiring line terminal section of the transparent substrate is formed; a sealing cap provided for a sealing region to cover the light emitting section such that ends of the sealing cap does not reach the ends of the transparent substrate or the wiring line terminal section of the transparent substrate; a flexible printed circuit board connected to the wiring line terminal section and extending along the sealing cap of the transparent substrate; and a semiconductor device mounted on the flexible printed circuit board for the light emitting section; by (b) connecting the flexible printed circuit board with semiconductor devices mounted to the wiring line terminal section of the transparent substrate; and by (c) fixing a frame around the ends of the transparent substrate.

Also, the (b) connecting step may be attained by forming the flexible printed circuit board; and by mounting the semiconductor devices on the flexible printed circuit board.

Also, the (b) connecting step may be attained by mounting the semiconductor devices on the flexible printed circuit board; and by forming the flexible printed circuit board with the semiconductor devices mounted.

Also, the forming step of the flexible printed circuit board may be attained by bending the flexible printed circuit board to a first direction opposite to the transparent substrate in a first position between the end of the sealing cap of and the wiring line terminal section of the transparent substrate; by further bending the flexible printed circuit board to the first direction in a second position between the first position and the end of the sealing cap; and by bending the flexible printed circuit board to a second direction opposite to the first direction in a third position between the second position and the end of the sealing cap.

Also, a bending angle in the first position is equal to or less than 60 degrees, a bending angle in the second position is equal to or less than 90 degrees, and a summation of the bending angle in the first position and the bending angle in the second position is equal to or less than 90 degrees.

Also, the forming step of flexible printed circuit board may further include the steps of: bending the flexible printed circuit board to the first direction opposite to the transparent substrate in a fourth position between the end of the sealing cap and an end of the light emitting section; and bending the flexible printed circuit board to the second direction opposite to the first direction in a fifth position between the fourth position and the end of the light emitting section.

DESCRIPTION OF THE PREFERRED EMBODIMENTS

Hereinafter, a flat panel display module of the present invention will be described with reference to the attached drawings. Here, in the flat panel display module 1 of the present invention, an organic EL (electro-luminescence) device is referred to as a display device. However, the display device is not limited to the organic EL device.

Figure 1:
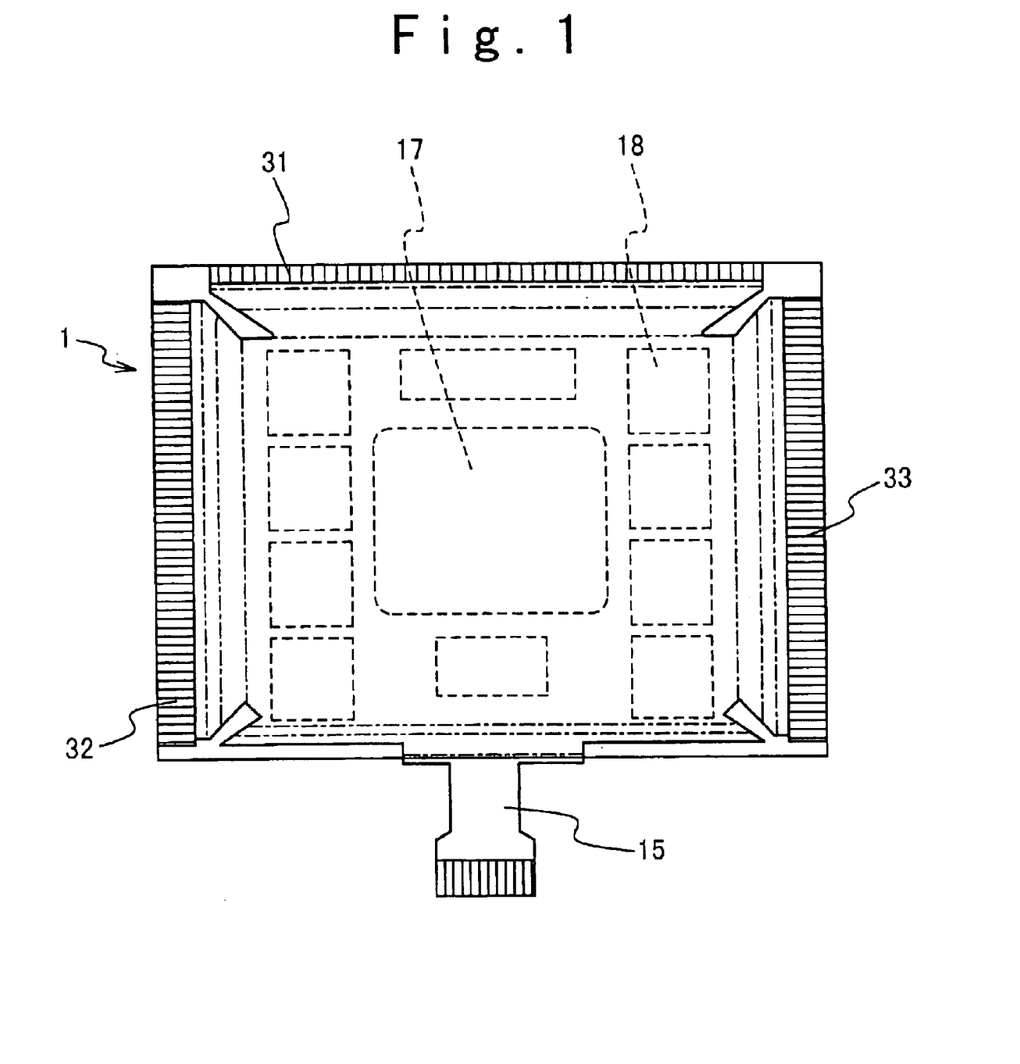
FIG. 1 is a back plan view showing the plane structure of a flat panel display module according to a first embodiment of the present invention.
Figure 2:
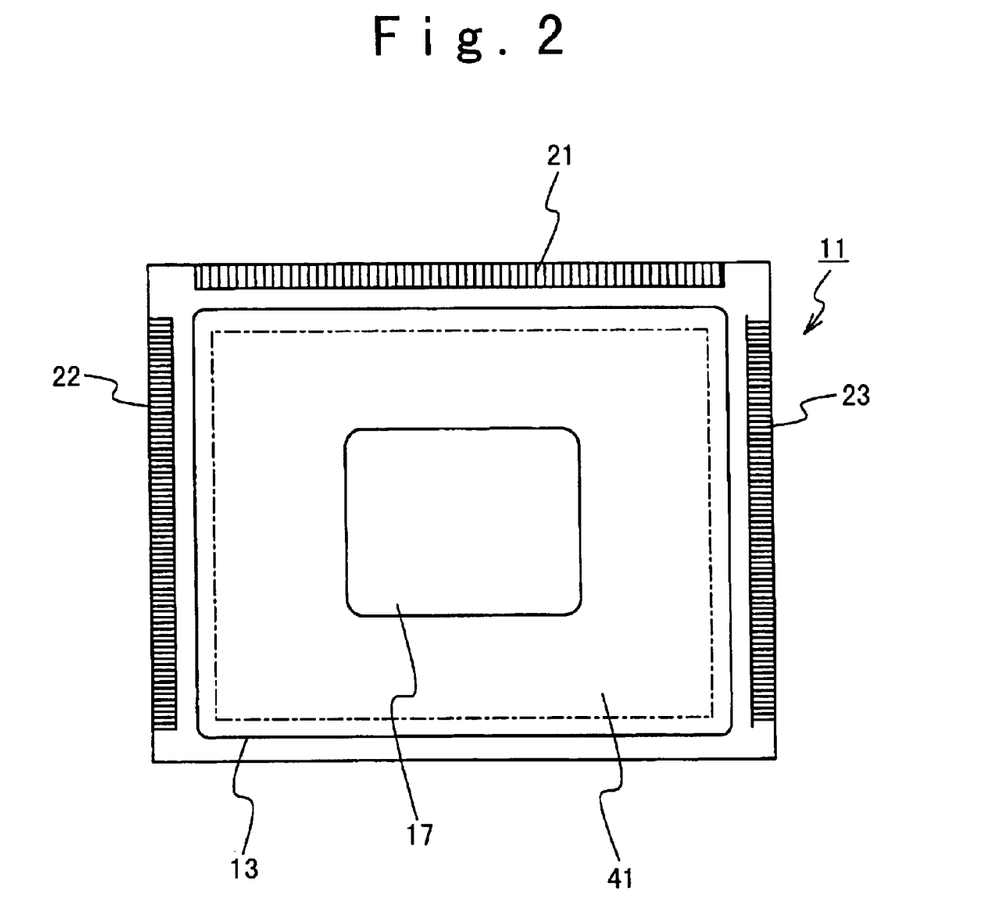
FIG. 2 is a plan view showing a display section used in the flat panel display module according to the first embodiment of the present invention.
Figure 3:
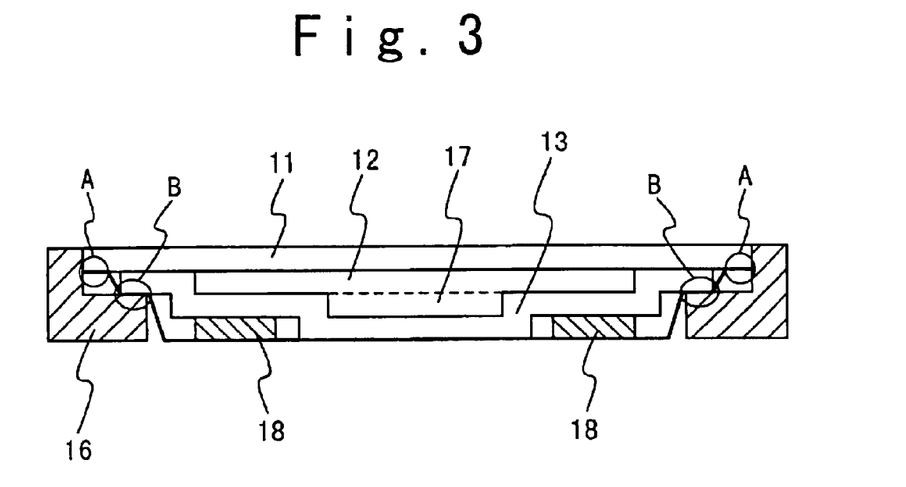
FIG. 3 is a cross sectional view showing a section along the long side of the flat panel display module according to the first embodiment of the present invention.

FIG. 1 is a back plan view of the flat panel display module according to the first embodiment of the present invention from the side of the back. FIG. 2 is a diagram showing a display section used in the flat panel display module 1 shown in FIG. 1. FIG. 3 is a cross sectional view of the flat panel display module shown in FIG. 1 in the longitudinal direction.

Referring to FIG. 1, FIG. 2 and FIG. 3, the flat panel display module 1 of the present invention is composed of the display section, a flexible printed circuit board 15 and a frame 16. The display section is composed of a transparent substrate 11, a display section 12, a sealing cap 13.

Referring to FIG. 1, the flat panel display module 1 according to the first embodiment of the present invention has a approximately rectangular shape, and a the wiring line section for connection to an external unit extends from the center of one of long sides. A display region is provided in the region within the sealing cap at the display section and a plurality of semiconductor devices 18 are arranged around the convex section at a the desiccant section in the center of the sealing cap. These semiconductor devices are provided to process the signals inputted from the wiring line section for the connection to the external unit and to drive the display section.

In FIG. 1, one chain line gives an outline of the bent positions when the flexible printed circuit board 15 is bent.

The transparent substrate 11 is composed of such a transparent member as a glass plate. The shape of the transparent substrate 11 is a rectangle substantively in this example. However, the shape is not limited to it. Referring to FIG. 2, the lower surface section of the transparent substrate 11 has a display region 41 and three the wiring line terminal sections 21, 22 and 23.

The terminal region 21 is provided for an end of the long side section which is opposite to the wiring line section for the external connection in the lower side of the transparent substrate 11. The wiring line terminal sections 22 and 23 are provided for ends of the two shorter side sections of the transparent substrate 11 respectively. The display region 41 is provided in the central section on the lower side section of the transparent substrate 11. In this example, the shape of the display region 41 is a rectangle substantively. The display section is driven in a matrix manner in response to drive signals supplied to the wiring line terminal sections 21, 22 and 23 from the semiconductor device. In this way, a desired image is displayed and an image can be seen through the transparent substrate 11.

FIG. 3 shows the structure of the lower side section of the transparent substrate 11. Referring to FIG. 3, a light emitting section 12 is composed of an organic EL device in this example. The emitting light section 12 is formed in the display region 41 of the transparent substrate 11 to have a predetermined thickness. The organic EL device is driven by the semiconductor device 18 and emits light. To protect the organic EL device against moisture, the desiccant section 17 is generally provided onto the organic EL device.

A sealing cap 13 is formed on the lower side section of the transparent substrate 11 to cover the light emitting section 12 and the desiccant section 17, and also to cover the transparent substrate 11 around the light emitting section 12. However, the ends of the sealing cap 13 do not reach the ends of the transparent substrate 11. The plane shape of the sealing cap 13 is a rectangle approximately in this example. Also, the sealing cap 13 has an approximately uniform thickness.

The sealing cap 13 has a first convex section below. The shape of this first convex section corresponds to the shape of the display region 41 and is larger than the shape of the display region 24. Also, the sealing cap 13 has the second convex section which protrudes from the first convex section far below. The shape of this second convex section corresponds to the desiccant section 17 and has the shape which is rather larger than the desiccant section 17. When the desiccant section 17 is unnecessary, of course, the second convex section does not exist. The plane of the lower side section of the first convex section and the plane of the lower side section of the second convex section in the sealing cap 13 are parallel to the plane of the transparent substrate 11 approximately.

The semiconductor devices 18 are mounted on the flexible printed circuit board 15. The semiconductor devices 18 are composed of a signal generating circuit to generate drive signals based on the input signal from the wiring line section for the external connection and a drive circuit to drive the light emitting section 12 based on the drive signals. However, depending on the circuit structure, only the drive circuit it is needed.

Referring to FIG. 1, the shape of the flexible printed circuit board 15 is rectangular approximately. However, the wiring line section for the external the wiring lines extend from the center section of the one of the long side. The wiring line terminal section 31 composed of the terminals which are connected with the terminals which are provided for the wiring line terminal section 21 of the transparent substrate 11 is provided for the other end of the long side of the flexible printed circuit board 15. Also, the wiring line terminal sections 32 and 33 which composed of the terminals connected with the terminals which are provided for the wiring line terminal sections 22 and 23 of the transparent substrate 11 are provided for the ends of the two shorter sides where the flexible printed circuit board 15 is opposite.

Also, in the flexible printed circuit board 15, a cut-out portion is formed in each of the corner sections between the long side sections and the shorter side sections. These cut-out portions are provided not to give influence to the long side section or the shorter side section when the long side section or shorter side section of the flexible printed circuit board 15 is bent.

The flexible printed circuit board 15 is connected with the wiring line terminal sections 21, 22 and 23 of the transparent substrate 11 at the wiring line terminal sections 31, 32 and 33. At this time, a wiring line terminal section is pressed and connected at the A section. In this way, the flexible printed circuit board 15 is arranged along the outer surface of the sealing cap 13 without being bent to be turned back.

Also, the upper surface section of the flexible printed circuit board 15 has a first region opposite to the lower side section of the first convex section of the sealing cap 13 and a second region opposite the lower side section of the second convex section of the sealing cap 13 when the flat panel display module is formed. The first region corresponds to the display region and is located in the center section of the surface section of the flexible printed circuit board 15. Also, the second region corresponds to the desiccant section 17 and is in the center of the first region.

Also, the plurality of semiconductor devices 18 are provided in the first region other than the second region in the surface section of the flexible printed circuit board 15 to drive the light emitting section 12. These semiconductor devices are connected using the wiring line pattern formed on the both sides of the flexible printed circuit board 15. Here, a resist film is applied onto the wiring line pattern.

Of these semiconductor devices 18, a drive circuit element is connected with the terminals of the wiring line terminal sections 31, 32 and 33 which were formed on the surface section of the flexible printed circuit board 15. The terminals in the wiring line terminal sections 31, 32 and 33 and the terminals in the wiring line terminal sections 21, 22 and 23 formed on the lower side section of the transparent substrate 11 are pressed and connected. These circuits allow to the drive signals to be supplied to the light emitting section 12.

Next, the connection of the flexible printed circuit board 15 to the transparent substrate 11 will be described below.

The length of each terminal in the wiring line terminal sections 21, 22 and 23 of the transparent substrate 11 is as very short as about 1.8 mm. Also, the pitch between the terminals is 0.088 mm in the wiring line terminal section 21 and is 0.272 mm in the wiring line terminal sections 22 and 23. The sealing cap 13 is formed to a near portion to the wiring line terminal sections 21, 22 and 23.

Figure 4:
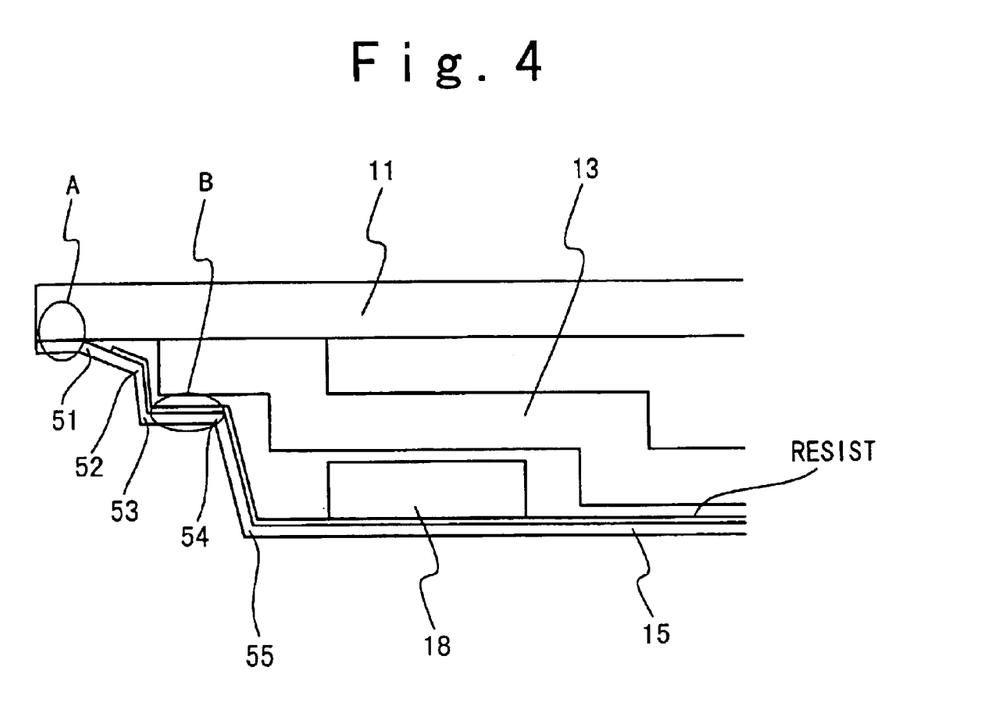
FIG. 4 is an expanded view showing a connection section of the flat panel display module according to the first embodiment of the present invention.

FIG. 4 is an expanded drawing of the connection section of the flexible printed circuit board 15 to the transparent substrate 11. Referring to FIG. 4, the wiring line patterns are basically printed on the both sides in the flexible printed circuit board. An insulative resist is applied onto the wiring line pattern. However, the wiring line pattern is formed only on the one side in the wiring line terminal section 31 on the long side of the flexible printed circuit board 15 and the wiring line terminal sections 32 and 33 on the shorter side, and a resist is not applied.

The length of the terminal of the wiring line terminal sections 31, 32 and 33 is equal to or less than 1.8 mm, as described above. In this example, the flexible printed circuit board 15 is bent to the first direction to leave the transparent substrate 11 in the first position 51 apart from the end by 1 mm. Therefore, the length for the flexible printed circuit board 15 to be pressed and connected to the transparent substrate 11 is about 1 mm and it is very narrow. It is easy for the flexible printed circuit board 15 to be peeled off the transparent substrate 11. If the flexible printed circuit board 15 is turned back as in the conventional example, the unnecessary force acts on the connection point A so that the flexible printed circuit board 15 has been easily peeled off the transparent substrate 11.

In the first position 51, the flexible printed circuit board 15 is further bent to the first direction at the angle within 60 degrees. In the first position 51, as described above, the wiring line pattern is formed only on the one side and any resist layer is not applied. Therefore, when the flexible printed circuit board 15 is bent to the too large angle at a time, there is fear that the wiring line is broken. Therefore, it is desirable that the bend angle is equal to or less than 60 degrees. In this example, the flexible printed circuit board 15 is bent by the 30 degrees.

Next, the flexible printed circuit board 15 is bent to the first direction in the second position 52 between the first position 51 and the sealing cap 13. In this position, the flexible printed circuit board may have the wiring line patterns on the both sides and may have the wiring line pattern on the one side. In any case, a resist layer is applied onto the wiring line pattern. The bending angle in the second position 52 is within 90 degrees. Because the resist layer is applied to this position even if the flexible printed circuit board 15 is supposed to have been bent at the larger angle, the wiring line is never broken. Also, it should be avoided that the flexible printed circuit board 15 is bent to turn back, such that unnecessary force acts on the connection section of the wiring line terminal section, as described above. Therefore, the bending angle in the second position 52 is desirably within 90 degrees. Also, it is desirable that a summation of the bending angle in the first position 51 and the bending angle in the second position 52 do not exceed 90 degrees. In this example, the bending angle in the second position 52 is about 60 degrees.

The flexible printed circuit board 15 is bent to the direction parallel to the transparent substrate 11 approximately in a third position 53 with the height which is approximately equal to the thickness of the sealing cap 13. It should be noted that the resist layer is applied to the flexible printed circuit board 15 on the side of the center in the display region from the second position 52. It is desirable that the flexible printed circuit board has a metal film on at least one side (on the back side in this example) of the circuit board, in one or both of the second position and the third position such that the plastic deformation property is increased at the bending position. The back plane of the flexible printed circuit board means a plane in which the wiring line pattern is not formed. Also, it is desirable that the metal film is formed on the whole back plane. The wiring line pattern is a metal film but separated from the metal film.

The flexible printed circuit board 15 is bent to the first direction in a fourth position 54 between the end of the sealing cap 13 and the end of the light emitting section 12. Moreover, the flexible printed circuit board 15 is bent to be parallel to the transparent substrate 11 in a fifth position 55 corresponding to the maximum height of the sealing cap 13.

The bending or forming process as described above is carried out respectively on the side of the long side and the shorter side in the flexible printed circuit board 15. In this way, the flexible printed circuit board 15 is arranged along the outer surface of the sealing cap 13 from one of the shorter sides to the other thereof in one of the surfaces of the transparent substrate 11 without being bent to be turned back. At this time, the space where it is possible for the semiconductor devices 18 to be installed is secured in the region between the fourth position 54 and the display region.

After the flexible printed circuit board 15 is arranged, the frame 16 is arranged along the ends of the transparent substrate 11. The frame 16 has a section of the character "L" and the bottom section extends to the display region. If the upper surface of the bottom section has a contact with the sealing cap 13 in the B section between the third position 53 and the fourth position 54, the flexible printed circuit board 15 can be sandwiched and supported by the frame 16 and the sealing cap 13 in the B section. Therefore, it is possible to prevent that unnecessary force acts on the connection section in the wiring line terminal sections 31, 32 and 33. In this case, even if the total bending angle including the bending angle in the second position 52 gets to be near 90 degrees or exceeds 90 degrees little, there is no case that the wiring line terminal sections 31, 32 and 33 peel off the wiring line terminal sections 21, 22 and 23 of the transparent substrate 11.

At this time, depending on the processing precision, there is a case that the flexible printed circuit board 15 cannot be sandwiched or supported by the sealing cap 13 and the frame 16. In such a case, an insulating filling film may be inserted between the sealing cap 13 and the frame 16.

Next, the method of manufacturing a flat panel display module of the present invention will be described below.

First, the light emitting section 12 is formed on the transparent substrate 11, and the light emitting section 12 is sealed by the sealing cap 13 so as to complete the display section. Next, the flexible printed circuit board 15 as described above is prepared. The semiconductor devices are mounted on predetermined positions of the flexible printed circuit board 15. The flexible printed circuit board 15 is pressed and connected on the wiring line terminal sections 21, 22 and 33 of the transparent substrate 11 in the wiring line terminal sections 31, 32 and 33. After that, the frame 16 is installed to the transparent substrate 11. At this time, it is desirable to sandwich and support the flexible printed circuit board 15 by the sealing cap 13 and the frame 16 as described above. In this way, the flat panel display module is completed.

It should be noted that the flexible printed circuit board 15 may be bent before the semiconductor devices 18 are mounted thereon or after the semiconductor devices 18 are mounted thereon.

Figure 5:
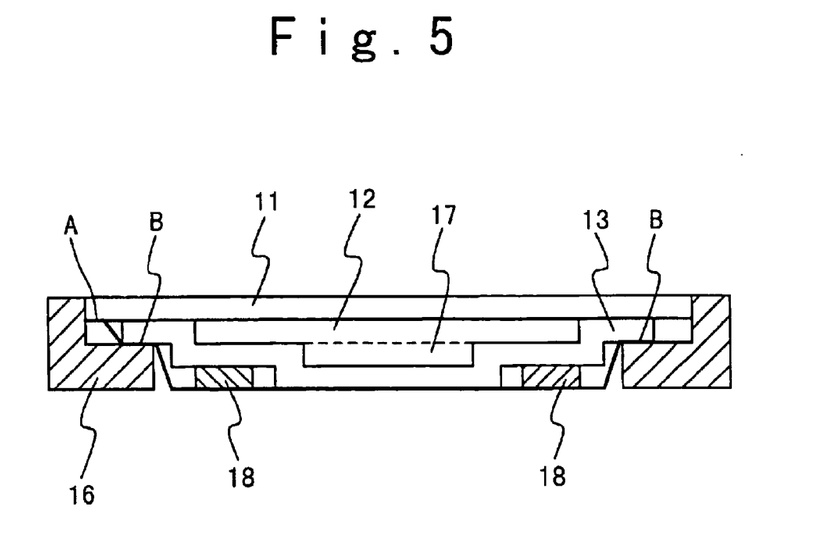
FIG. 5 is a partial cross sectional view showing a section according to the long side of the flat panel display module according to a second embodiment of the present invention.

Next, the flat panel display module in the second embodiment of the present invention will be described. FIG. 5 is a cross section view of the flat panel display module in the second embodiment of the present invention.

Referring to FIG. 5, in the second embodiment, the bent shape of the flexible printed circuit board 15 is same as the first embodiment. However, the flexible printed circuit board 15 has the wiring line terminal sections 31 and 32 but does not have the wiring line terminal section 33. The semiconductor devices are arranged in the sealing region on the side of the wiring line terminal section 32 and the sealing region on the side of the wiring line terminal section 33. Here, the sealing region is the region corresponding to the first convex section of the sealing cap 13 other than the second convex section. On the shorter side of the flexible printed circuit board 15, the flexible printed circuit board 15 is supported by the sealing cap 13 in the sealing region and the frame 16.

Figure 6:
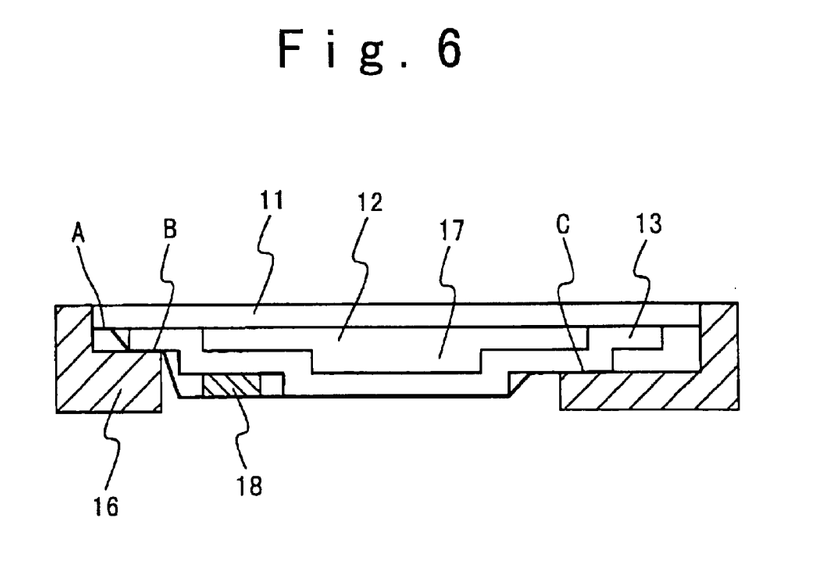
FIG. 6 is a cross sectional view showing a section according to the long side of the flat panel display module according to a third embodiment of the present invention.

Next, the flat panel display module in the third embodiment of the present invention will be described. FIG. 6 is a cross sectional view of the flat panel display module in the third embodiment of the present invention.

Referring to FIG. 6, in the third embodiment, the flexible printed circuit board 15 has the wiring line terminal sections 31 and 32 but does not have the wiring line terminal section 33. Also, the semiconductor devices are arranged only in the sealing region on the side of the wiring line terminal section 32. On the side of the long side of the flexible printed circuit board 15, the bent shape of the flexible printed circuit board is same as the first embodiment. Therefore, the flexible printed circuit board 15 is supported by the sealing cap 13 in the display region and the frame 16.

Also, on the side of the wiring line terminal section 32 of the flexible printed circuit board 15, the bent shape of the flexible printed circuit board is same as the first embodiment. Therefore, the flexible printed circuit board 15 is supported by the sealing cap 13 in the display region and the frame 16. However, the flexible printed circuit board 15 is bent to extend along the second convex section and the first convex section of the sealing cap 13 on the side of the shorter side corresponding to the wiring line terminal section 32. Also, the flexible printed circuit board 15 is sandwiched and supported in the C section by a section corresponding to the display region of the sealing cap 13 and the frame 16.

Figure 7:
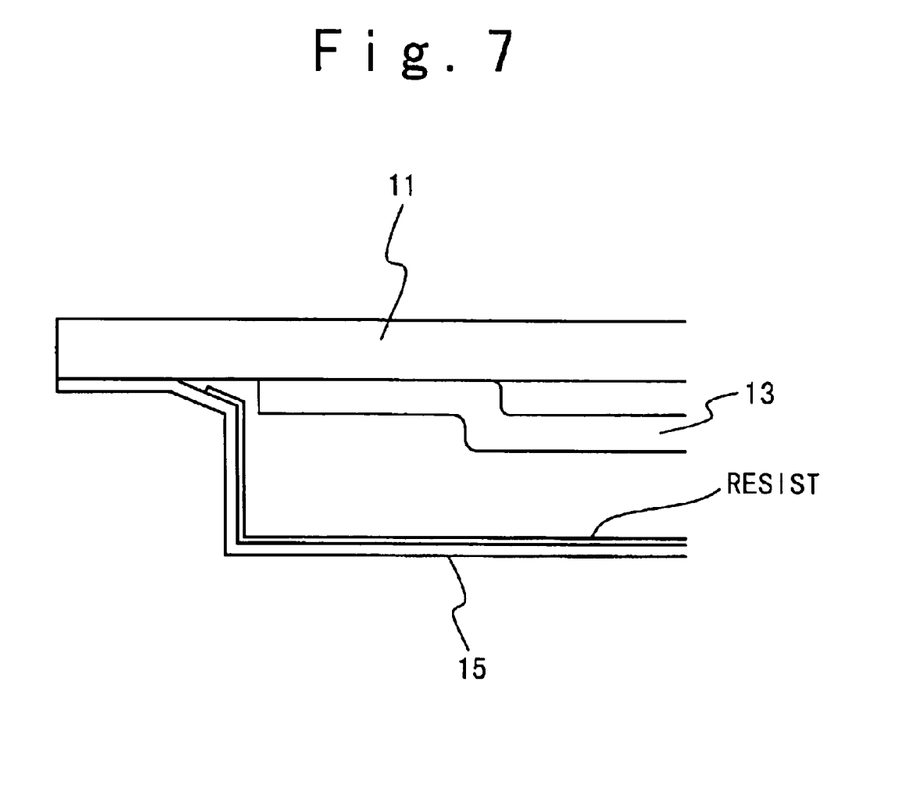
FIG. 7 is an expanded view showing an expansion section of the connection section of the flat panel display module according to a fourth embodiment of the present invention.

Next, the flat panel display module in the fourth embodiment of the present invention will be described. FIG. 7 is a cross sectional view of the flat panel display module in the fourth embodiment of the present invention.

Referring to FIG. 7, in the fourth embodiment, the bending process is not carried out to the flexible printed circuit board 15 in the fourth and the fifth position. Also, the height of the third position from the transparent substrate 11 is set to be equal to the height of the fifth position. Therefore, the flexible printed circuit board 15 is never sandwiched and supported by the frame 16 and the sealing cap 13. Therefore, force acts directly on the connection section, but there is a merit that the semiconductor device mounting section can be widely used.

As mentioned above, according to the flat panel display module of the present invention, the flexible printed circuit board is connected to the connection terminal section of the transparent substrate without being turned back. Therefore, there is no fear that unnecessary force acts on the connection section so that the flexible printed circuit board is peeled off the transparent substrate. Also, even if the width of the connection section is narrow, it is difficult for unnecessary force to act, because the flexible printed circuit board is arranged along the connection section. Therefore, the flexible printed circuit board is bent to have a small angle at first, and is next bent to have the larger angle.

In case of this bending process, the wiring line pattern is never broken because the bending angle is small in the first bending section. Also, there is not fear that the wiring line pattern is broken because the wiring line pattern is protected by the resist layer in this section although the bend angle is large in the next bending section.

Also, because the flexible printed circuit board is sandwiched and supported by the frame and the sealing cap, it is difficult for the force to act on the connection section.

Also, the semiconductor device to drive the light emitting section such as the organic EL device is provided for the free space from the sealing cap for protecting the light emitting section on the side of the light emitting section of the flexible printed circuit board. Therefore, the semiconductor device never protrudes and the flat panel display module can be made thin.

In this way, according to the present invention, the flat panel display module can be made small and thin. Moreover, as mentioned above, to prevent break of the wiring line pattern due to the bending process, the flexible printed circuit board is previously bent. Thus, it is possible to provide the flat panel display module which has sure connection in a small number of steps.

What is claimed is:

1. A manufacturing method of a flat panel display module, comprising the steps of:
    (a) forming a display section, wherein said display section comprises a transparent substrate having a wiring line terminal section disposed on a first surface of said transparent substrate along at least one edge of said transparent substrate; a light emitting section provided in a display region in a center section on said first surface; a sealing cap disposed on the first surface of the transparent substrate so as to cover said light emitting section, the sealing cap being dimensioned such that an edge of said sealing cap nearest the wiring line terminal section does not reach said wiring line terminal section of said transparent substrate;
    (b) providing a flexible printed circuit board having a semiconductor device mounted on said flexible printed circuit board for said light emitting section;
    (c) connecting said flexible printed circuit board with semiconductor devices mounted thereon to said wiring line terminal section of said transparent substrate; and
    (d) fixing a frame around said transparent substrate.

2. The manufacturing method according to claim 1, wherein said step (b) comprises the steps of:
    forming said flexible printed circuit board; and
    mounting said semiconductor devices on said flexible printed circuit board.

3. The manufacturing method according to claim 1, wherein said step (b) comprises the steps of:
    mounting said semiconductor devices on said flexible printed circuit board; and
    forming said flexible printed circuit board with said semiconductor devices mounted.

4. The method of claim 1, wherein the flexible printed circuit board with the semiconductor devices mounted thereon is connected to the wiring line terminal section of the transparent substrate so that the flexible printed circuit board extends along the transparent substrate and the sealing cap without being turned back.

5. The manufacturing method of claim 1, wherein the transparent substrate is a non-conductive glass substrate.

6. The manufacturing method of claim 5, wherein the flat panel display module is constructed and arranged so that pixels are formed on the transparent substrate.

7. A manufacturing method of a flat panel display module, comprising the steps of:
    (a) forming a display section, wherein said display section comprises a transparent substrate having a wiring line terminal section which is formed on one of surfaces of said transparent substrate in at least one of opposing ends of said transparent substrate; a light emitting section provided in a display region in a center section on said surface on which the said wiring line terminal section of said transparent substrate is formed; a sealing cap provided for sealing region to cover said light emitting section such that ends of said sealing cap does not reach said ends of said transparent substrate or said wiring line terminal section of said transparent substrate; a flexible printed circuit board connected to said wiring line terminal section and extending along said sealing cap of said transparent substrate; and a semiconductor device mounted on said flexible printed circuit board for said light emitting section;
    (b) connecting said flexible printed circuit board with semiconductor devices mounted to said wiring line terminal section of said transparent substrate; and
    (c) fixing a frame around said ends of said transparent substrate;
    wherein said forming step of said flexible printed circuit board comprises the steps of:
    bending said flexible printed circuit board to a first direction opposite to said transparent substrate in a first position between said end of said sealing cap of and said wiring line terminal section of said transparent substrate;
    further bending said flexible printed circuit board to said first direction in a second position between said first position and said end of said sealing cap;
    bending said flexible printed circuit board to a second direction opposite to said first direction in a third position between said second position and said end of said sealing cap.

8. The manufacturing method according to claim 7, wherein a bending angle in said first position is equal to or less than 60 degrees,
    a bending angle in said second position is equal to or less than 90 degrees, and
    a summation of the bending angle in said first position and the bending angle in said second position is equal to or less than 90 degrees.

9. The manufacturing method according to claim 7, wherein said forming step of flexible printed circuit board further comprises the steps of:
    bending said flexible printed circuit board to said first direction opposite to said transparent substrate in a fourth position between said end of said sealing cap and an end of said light emitting section; and
    bending said flexible printed circuit board to said second direction opposite to the said first direction in a fifth position between said fourth position and the end of said light emitting section.

10. A manufacturing method of a flat panel display module, comprising the steps of:
    (a) forming a display section, wherein said display section comprises a transparent substrate having a wiring line terminal section disposed on a first surface of said transparent substrate adjacent at least one edge of said transparent substrate; a light emitting section provided in a display region in a center section on said first surface; a sealing cap disposed on the first surface of the transparent substrate so as to cover said light emitting section, the sealing cap being dimensioned such that an edge of said sealing cap nearest the wiring line terminal section lies inside the wiring line terminal section;
    (b) providing a flexible printed circuit board, and bending the flexible circuit board to have first through third bends in order from a first edge of the flexible circuit board, the first and second bends being in a first direction, the third bend being in a second, opposite direction, wherein the flexible printed circuit board has a semiconductor device mounted thereon;

(c) connecting the flexible printed circuit board to the transparent substrate so that the first edge of the flexible circuit board is aligned with the wiring line terminal section of the transparent substrate, and so that each of the first through third bends lies outside a perimeter of the sealing cap; and (d) fixing a frame around the transparent substrate.

11. The method of claim 10, wherein each of the first and second bends defines an angle of less than 90°.

12. The method of claim 11, wherein the angles defined by the first and second bends sum to no more than 90°.

13. The method of claim 10, wherein the frame is arranged so that a portion of the flexible printed circuit board is sandwiched between the frame and the sealing cap.

14. The method of claim 13, wherein the portion of the flexible printed circuit board sandwiched between the frame and the sealing cap lies between the third bend in the flexible printed circuit board and the semiconductor device mounted on the flexible printed circuit board.

15. A manufacturing method of a flat panel display module, comprising the steps of:

(a) forming a display section, wherein said display section comprises a transparent substrate having a wiring line terminal section disposed on a first surface of said transparent substrate adjacent at least one edge of said transparent substrate; a light emitting section provided in a display region in a center section on said first surface; a sealing cap disposed on the first surface of the transparent substrate so as to cover said light emitting section, the sealing cap being dimensioned such that an edge of said sealing cap nearest the wiring line terminal section lies inside the wiring line terminal section;

(b) providing a flexible printed circuit board having a semiconductor device mounted thereon;

(c) connecting the flexible printed circuit board to the transparent substrate so that an edge of the flexible circuit board is aligned with the wiring line terminal section of the transparent substrate; and (d) fixing a frame around the transparent substrate so that a portion of the flexible printed circuit board is sandwiched between the frame and the sealing cap.

16. The method of claim 15, wherein the portion of the flexible printed circuit board sandwiched between the frame and the sealing cap lies between the wiring line terminal section of the transparent substrate and the semiconductor device mounted on the flexible printed circuit board.

* * * * *